(12) United States Patent
Kosmowski (10) Patent No.: US 9,504,163 B2
(45) Date of Patent: Nov. 22, 2016

(54) Y AXIS BEAM POSITIONING SYSTEM FOR A PCB DRILLING MACHINE

(71) Applicant: Wojciech B. Kosmowski, San Juan Capristrano, CA (US)

(72) Inventor: Wojciech B. Kosmowski, San Juan Capristrano, CA (US)

( * ) Notice: Subject to any disclaimer, the term of this patent is extended or adjusted under 35 U.S.C. 154(b) by 155 days.

(21) Appl. No.: 14/471,430

(22) Filed: Aug. 28, 2014

(65) Prior Publication Data

US 2016/0066432 A1   Mar. 3, 2016

(51) Int. Cl.
*B23B 39/08* (2006.01)
*H05K 3/00* (2006.01)

(52) U.S. Cl.
CPC ............ *H05K 3/0047* (2013.01); *B23B 39/08* (2013.01); *H05K 3/0008* (2013.01); *B23B 2270/32* (2013.01); *H05K 2203/0165* (2013.01); *H05K 2203/163* (2013.01); *H05K 2203/166* (2013.01)

(58) Field of Classification Search
CPC ............... B23B 39/04; B23B 39/08; B23B 2270/32; B23B 2270/34; B23B 2270/38; H05K 3/0047; H05K 2203/163; H05K 2203/166; B23Q 15/22; B23Q 15/24
See application file for complete search history.

(56) References Cited

U.S. PATENT DOCUMENTS

| | | | | |
|---|---|---|---|---|
| 3,663,114 A | * | 5/1972 | Welsh | B23B 39/08 408/3 |
| 4,596,500 A | * | 6/1986 | Raiteri | H05K 3/0047 408/13 |
| 4,786,216 A | * | 11/1988 | Kitagawa | B23B 41/00 408/69 |
| 4,932,117 A | * | 6/1990 | Reed | B23B 35/005 408/68 |

(Continued)

FOREIGN PATENT DOCUMENTS

| | | | | |
|---|---|---|---|---|
| DE | 1477683 A1 | * | 7/1969 | ............ B23B 39/04 |
| DE | 3921547 C1 | * | 9/1990 | ............ B23B 39/04 |

(Continued)

*Primary Examiner* — Eric A Gates
*Assistant Examiner* — Donte Brown
(74) *Attorney, Agent, or Firm* — Mark S Hubert (57) ABSTRACT

A positioning system for a gantry adapted to move in the horizontal, X-Y plane that utilizes up to 80% less energy to operate than commercial machines, while at the same time decreasing the position settling times by 50%, and achieving this with an "in position window" of 2-3 microns, (a settling window) beating the current industry in position window of 7-12 microns. It accomplishes this through a novel synergistic overall design that utilizes a much lighter and much stiffer moving mass resulting in the moving components having an increased natural frequency. With this system on any style of PCB drilling machine, the drill bit life is extended in two ways: they do not dull as fast and they do not break as often. This is because the small in position window ensures that as the drill bits plunge into the substrate to be drilled (a PCB board) the drill unit sees very little (Continued)

motion in the horizontal plane thus keeping the bits from wandering upon hole initiation and from experiencing excessive horizontal plane sheer forces (side loads) when starting their plunge into the substrate.

7 Claims, 6 Drawing Sheets (56) References Cited

U.S. PATENT DOCUMENTS

| | | | | |
|---|---|---|---|---|
| 5,230,685 | A * | 7/1993 | Christen | B23B 39/161 408/43 |
| 5,253,429 | A * | 10/1993 | Konno | B23Q 1/5406 33/1 M |
| 5,332,340 | A * | 7/1994 | Pumphrey | B23Q 41/00 408/1 R |
| 5,584,788 | A * | 12/1996 | Piovano | B23B 39/16 408/43 |
| 5,920,973 | A * | 7/1999 | Kosmowski | B23B 39/16 29/26 A |
| 6,000,124 | A * | 12/1999 | Saito | H05K 3/4638 156/64 |
| 6,039,680 | A * | 3/2000 | Oketani | B23Q 1/25 483/47 |
| 6,040,675 | A * | 3/2000 | Ono | B23Q 15/22 108/146 |
| 6,098,274 | A * | 8/2000 | Raiteri | B23Q 1/601 29/739 |
| 6,109,840 | A * | 8/2000 | Raiteri | B23Q 3/186 269/309 |
| 6,183,190 | B1 * | 2/2001 | Raiteri | B23Q 7/00 269/54.5 |
| 6,527,686 | B1 * | 3/2003 | Houser | B23B 39/161 294/104 |
| 6,623,219 | B2 * | 9/2003 | Nagasawa | B23Q 1/601 33/1 M |
| 6,694,627 | B2 * | 2/2004 | Ito | H05K 3/0047 33/1 M |
| 6,857,828 | B2 * | 2/2005 | Weber | B23B 35/00 408/1 R |
| 7,134,817 | B2 * | 11/2006 | Kado | B23Q 11/0046 408/16 |
| 7,467,449 | B1 * | 12/2008 | Lee | B23B 39/06 29/26 A |
| 7,637,702 | B2 * | 12/2009 | Furukawa | B23B 35/00 408/1 R |
| 8,051,754 | B2 * | 11/2011 | Kase | B23B 25/06 82/1.11 |
| 8,356,961 | B2 * | 1/2013 | Kumagai | B23Q 1/032 408/1 R |
| 8,782,874 | B2 * | 7/2014 | Tuningley | B23B 39/08 104/16 |
| 8,864,426 | B2 * | 10/2014 | Winckler | B23Q 5/263 408/130 |
| 2002/0146294 | A1 * | 10/2002 | Martinez | B23Q 1/012 408/1 R |
| 2004/0202517 | A1 * | 10/2004 | Kowmowski | B23B 39/161 408/53 |

FOREIGN PATENT DOCUMENTS

| | | | | |
|---|---|---|---|---|
| DE | 10043529 | A1 * | 3/2002 | B23B 39/04 |
| DE | 102005058493 | A1 * | 6/2007 | B21J 15/14 |
| FR | 1208593 | A * | 2/1960 | B23B 39/04 |
| FR | 2520182 | A1 * | 7/1983 | H05K 3/0008 |
| GB | 854256 | A * | 11/1960 | B23B 39/04 |
| GB | 1485114 | A * | 9/1977 | B21D 43/13 |
| JP | 55112706 | A * | 8/1980 | B23B 39/04 |
| JP | 10015937 | A * | 1/1998 | B28D 1/14 |
| JP | WO 2007099654 | A1 * | 9/2007 | H05K 3/0058 |
| WO | WO 0226440 | A1 * | 4/2002 | B23B 39/161 |

* cited by examiner

Y AXIS BEAM POSITIONING SYSTEM FOR A PCB DRILLING MACHINE

The present invention involves a novel design for an enhanced y axis beam positioning system for a printed circuit board (PCB) substrate drilling machine that greatly increases the speed, and precision with which the machine can position and settle its Y axis beam.

BACKGROUND OF THE INVENTION

There is a huge industry developed around the demand to drill multiple, spaced holes (through or non-through) in substrates such as electronic wafers, thin film electronics, organic packaging substrates, glass, silicon wafers, sapphires or the like. These holes or patterned drillings may be used for electrical connections, filtration, cytology, bioassays, chemotaxis, or particle monitoring and have diameters that commonly lie in the micron range. Not only must the holes be identical to each other in diameter but also must be placed at precise locations and with the right geometry with respect to the substrate or adjacent holes.

Generally, such drilling machines see movement in all three axes simultaneously although this can be accomplished in different ways. Generally, the substrate is positionally moved in the horizontal X axis beneath a drill that plunges in the Z vertical axis after the drill has been positionally moved in the Y horizontal axis atop the substrate by a gantry unit. (The gantry unit is comprised of a motor driven stiffened beam to which the drill is affixed along with the necessary electrical, air and water supplies.) Optionally, the gantry Y axis positioning remains as above, but the drill unit may be positionally moved in the X axis along the face of the beam while the substrate is held motionless below the gantry unit. In either system drilling is initiated once the drill is in the proper position with respect to the substrate as indicated by a set of metrology positioning sensors on the machine. Optionally, at least one pressure foot may be used to secure the PCB substrate to the z axis drill unit. This positioning prior to drilling occurs extremely rapidly by computer control, cycling up to thousands of times per minute. Pursuant to Newton's third law of motion, each of these three positioning movements creates a reactionary force in the structure of the PCB substrate drilling machine. Since it is this machine that metrology positioning sensors are coupled to, the settling time or lag for the PCB substrate to be positioned within the acceptable ranges of the feedback sensors (prior to the initiation of drilling) is slowed by the effects of the reactionary forces, thus slowing the positioning process and adding slight inaccuracies in the positioning and eventual placement of the holes in the PCB.

Prior art PCB substrate drilling systems rely on the use of a massive, heavy machine base to minimize these reactionary forces coupled with light moving masses of the gantry and attached components as well as an extremely stiff beam, however, these reactionary forces still inherently reside in the machine and serve to limit the speed and precision of positioning at which the machine can function.

In the prior art, the Y axis positioning of the beam is accomplished by a central linear drive motor that positions the rigid beam on feedback from centrally mounted positioning sensors. The outermost right and left ends of the beam are assumed to be in line with the center of the beam with respect to the Y axis by virtue of the beam's stiffness. This is correct, but within measurable spatial limitations as the beam still has some flex. This flex causes the settling time at the end of each positioning to become longer thus cancelling out any move time reduction gained by the improved acceleration of the lighter moving masses. Generally, the sensors operate with moderately large settling windows (in the 0.2 micron range) in the Y axis. These prior art solutions that increase the mass of the machine base (reaction mass) and make the moving masses lighter do not completely address the root cause of the problem—that all parts of the gantry (and beam) are not completely aligned in the Y axis as indicated by the metrology system. For the PCB drilling machine to address this causes additional Y axis positional settling time.

Henceforth, a PCB substrate drilling machine with a faster and more precise way to position and settle in the Y axis would fulfill a long felt need in the substrate drilling and surface patterning industry. If such an invention accomplished this by enhancing the positioning of the Y axis beam, it would be compatible with either of the current styles of PCB drilling machines. This new invention utilizes and combines known and new technologies in a unique and novel configuration to overcome the aforementioned problems and accomplish this.

SUMMARY OF THE INVENTION

The present invention, which will be described subsequently in greater detail, relates to a PCB substrate drilling apparatus adapted to provide both speed and accuracy for the user resulting in a higher drilling or machining throughput. More particularly, to a PCB substrate drilling apparatus that minimizes the Y axis positional settling time and positions the Y axis beam with a higher degree of precision that what is currently available. It has many of the advantages mentioned heretofore and many novel features which are not anticipated, rendered obvious, suggested, or even implied by any of the prior art, either alone or in any combination thereof.

In accordance with the invention, an object of the present invention is to provide an improved PCB substrate drilling apparatus capable of enhanced Y axis positioning by shorter beam settling times and a tighter tolerance settling window for the Y axis positioning across all points of the beam.

It is another object of this invention to provide an improved PCB substrate drilling apparatus capable of surpassing the current number of holes drilled in PCB substrates per unit time and remain within operational tolerances.

It is a further object of this invention to provide a PCB substrate drilling apparatus that increases the precision of the location of the drilled holes.

It is still a further object of this invention to an improved apparatus and method of positioning of the Y axis beam that is compatible with either style of PCB drilling machine.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements. Other objects, features and aspects of the present invention are discussed in greater detail below.

There has thus been outlined, rather broadly, the more important features of the invention in order that the detailed description thereof that follows may be better understood and in order that the present contribution to the art may be better appreciated. There are, of course, additional features

DETAILED DESCRIPTION

All discussion of the geometry involved in describing the present invention is made with reference to a three dimensional Cartesian Coordinate System where the z axis is vertical and pointing up (positive up), so that the x and y axes lie on a horizontal plane where the x axis is shown as positive pointing "out of the page" towards the viewer, and the y axis is shown as positive on the right side of the z axis.

The term "gantry unit"or "gantry"as used herein is comprised of a linear motor driven stiffened linear member called a "beam", on the face of which a drill is affixed. The gantry unit also contains the necessary electrical, pneumatic and water supply connections to enable the gantry to move and position in the Y axis as well as for the drills to plunge drill and move and position in the X axis if required. It resides on a set of rails and uses linear positioning sensors to provide feedback signals to the computerized drive system of the linear motor.

There are basically two types of PCB drilling machines. In the first type the drilling unit is positioned in the Y axis by movement in the Y axis of the gantry unit that it is mounted to and the substrate to be drilled is positioned in the X axis below the drilling unit. The drill, which is mounted to the gantry face, plunges in the Z axis into the substrate. In the second type of PCB drilling machine, the drilling unit is also positioned in the Y axis by movement in the Y axis of the gantry unit, however, the drilling unit is moved in the X axis along the face of the beam while the substrate to be drilled is held stationary below it. Again, the drill, plunges in the Z axis into the substrate. The present invention is equally applicable and capable of being incorporated into either of these machines as it only deals with the movement of the Y axis beam. Herein, all explanation will be generic to both types of PBC drilling machines described above.

Generally, PCB substrate drilling machines perform four functions: ensuring the drill is positioned in the correct X axis location relative to the PCB substrates below, ensuring the drilling unit is in the correct Y axis location relative to the PCB substrates below; verifying the location of the PCB substrate in relation to the drilling unit through feedback sensor measurement and; plunging the drill bit in the z axis into the stacked PCB substrates. The Y axis positioning of these machines is accomplished by the linear movement of the gantry.

In the prior art devices, the main linear member of the gantry (the beam) is driven by a single linear motor, (centrally located) that moves the beam in the Y axis from its center along a set of three parallel guiding rails. The measurement function (metrology) of the beam's Y axis position that drives the single linear motor, is also accomplished by at least one position feedback sensor located centrally on the gantry. This is not the optimal design.

The present invention is for a Y axis beam positioning system that can be incorporated into a PCB drilling machine or any other like production machine requiring precise positioning in the Y or X axis. It uses a configuration that has multiple parallel guide rails, dual, parallel linear drives (motors) and dual linear drive positioning units that provide positioning feedback to a linear motor drive software controller that is capable of driving the two linear motors in synchronization so as to maintain linear scalable positions within 2-3 microns. (It is to be noted that such precise control, which has only been technically achievable recently, is critical to the operation of the present invention.) It also utilizes a stiffened lightweight beam design as well as a set of outrigger flexures mounted at either of the beam's ends and residing between the beam and the linear guiding system.

There are four main sources of positional inaccuracies across a Y axis beam: thermal expansion of the Y axis beam; deflection of the Y axis beam; non parallel or non straight guide rails; and positional measurement and movement being performed from the Y axis beam's midpoint only. Having the Y axis beam driven and positionally monitored with high resolution linear scales from both ends rather than in the center, along with the stiffened lightweight beam and the outrigger flexures, eliminates and compensates for any of the afore mentioned guiding geometry issues that cause these positional inaccuracies and affect the Y axis positioning of the drills (spindles).

Looking at FIGS. 1-4 the various components of the Y axis beam positioning system can best be seen. The gantry 2 is made up of a stiffened linear member of laminated steel called a beam 4 upon which are mounted the other various gantry components and utility supply lines. Z axis drills 6 are mounted on a moveable spindle mounting plate 10 that is connected to the gantry face 8 by a pair of X axis parallel linear rails 12 and their attached X axis linear ball bearing guides 14. The gantry 2 sits atop of a massive base 16 (generally of granite) that has been vibration isolated from the ground.

On the base 16 is a set of three Y axis guiding rails that are aligned parallel to each other. There is a central guiding rail 18 and two beam end guiding rails 20, each having multiple Y axis linear guides 22 slidingly mounted thereon. These linear guides 22 have pre loaded angular contact ball bearings (to increase stiffness and improve guiding accuracy) with a high self aligning capacity and a high load carrying capacity in the vertical direction. Adjacent each beam end guiding rails 20 are linear motor magnets 24 and scales 26. Affixed between the linear guides 22 that are mounted on the beam end guiding rails 20, and the beam end squaring plates 34 are spring steel flexure mounts 30. (See FIG. 5) Affixed between the linear guides 22 that are mounted on the central guiding rail 18 and the central squaring plate 32, is a solid block mount 28. This prevents any movement towards either end of the beam 4 but allows expansion from the center out toward the two flexure mounts 30. (It is to be noted that the flexure mounts 30 and the block mount 28 are not illustrated in FIG. 4 so as to prevent illustrative confusion.) The squaring plates 32 and 34 are affixed to the bottom side of the Y axis beam. The three squaring plates 32 and 34 serve to allow the perfect alignment of the beam 4 perpendicular to the guiding rails 18 and 20. On the bottom face of the beam end squaring plates 34 are linear motors 36 that reside adjacent and about linear motor magnets 24 that are linear magnetic strips parallel to the guiding rails. Together these form the two linear drive systems. The motors provide synchronized movement from signals generated by a linear motor drive software controller 52 located in the control cabinet 54. The software controller 52 receives position signals from the high resolution feedback sensor unit, and desired location data from a main computer system and through algorithmic determination outputs a drive signal to the dual linear motors 36 to coordinate the rapid movement from the beam's current position to the location designated by the main computer system.

Figure 6:
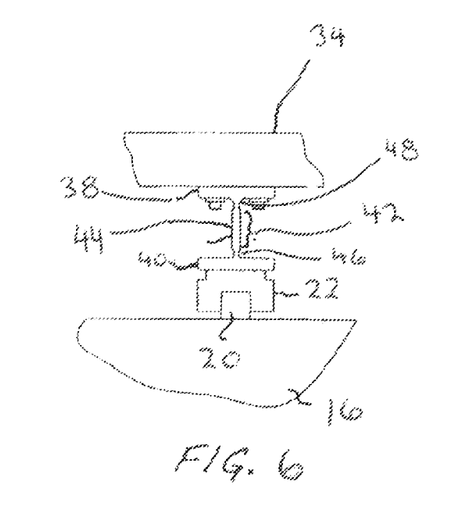
FIG. 6 is an end view of the Y axis rails illustrating the outrigger flexure mounts.

The flexure mounts 30 connect the linear guides 22 to the bottom surface of the beam 4 via the beam end squaring plates 34. These flexure mounts 30 are fabricated of a spring steel material. Looking at FIG. 6 which shows a flexure mount 30 in detail, it can be seen that it has a generally I-shaped cross-section configuration. A flat top web portion 38 is secured to the bottom surface of the beam end squaring plate 34 by threaded fasteners. A flat bottom web portion 40 is connected to the linear guides 22, also by threaded fasteners. The top and bottom web portions are joined by a middle web portion 42. The middle web portion 42 has a relatively large thickness in the central part 44, but a relatively thin dimension at points 46 and 48 where the middle web portion 42 connects to the top and bottom web portions, 38 and 40 respectively. These relatively thin areas allow the flexure mount 30 to flex or comply in response to differential thermal expansion rates between the base 16 and the beam 4, or to compensate for bearing rail misalignment. In an exemplary embodiment, the middle web portion 42 has a height of 2.5 inches, with thickness dimensions of 0.260 inches and a thickness measurement of 0.093 inches at points 46 and 48.

Figure 7:
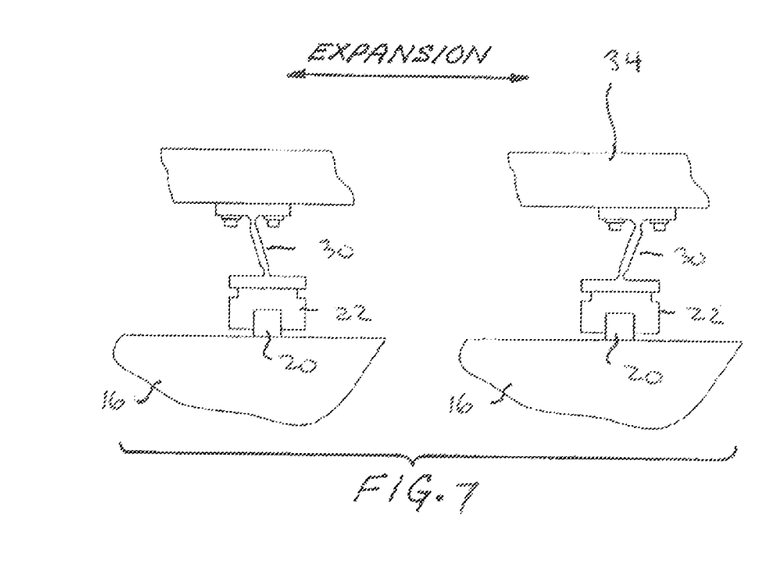
FIG. 7 is an end view of the movement of the outrigger flexures compensating for differential thermal expansion and rail misalignment.

FIG. 7 illustrates an exaggerated compliance condition of the flexure mounts 30 due to differential thermal expansion between the base 16 and the beam 4. Assume that the beam 4 has a higher expansion rate than the base 16. Instead of developing stress in the linear guide's bearings, the flexure mounts flex at the regions of reduced thickness, as illustrated in exaggeration in FIG. 7. At the same time, the flexure mounts 30 maintain stiffness in the Y and Z directions. In this way all internal stresses of the beam are deflected through the flexure mounts 30.

Figure 1:
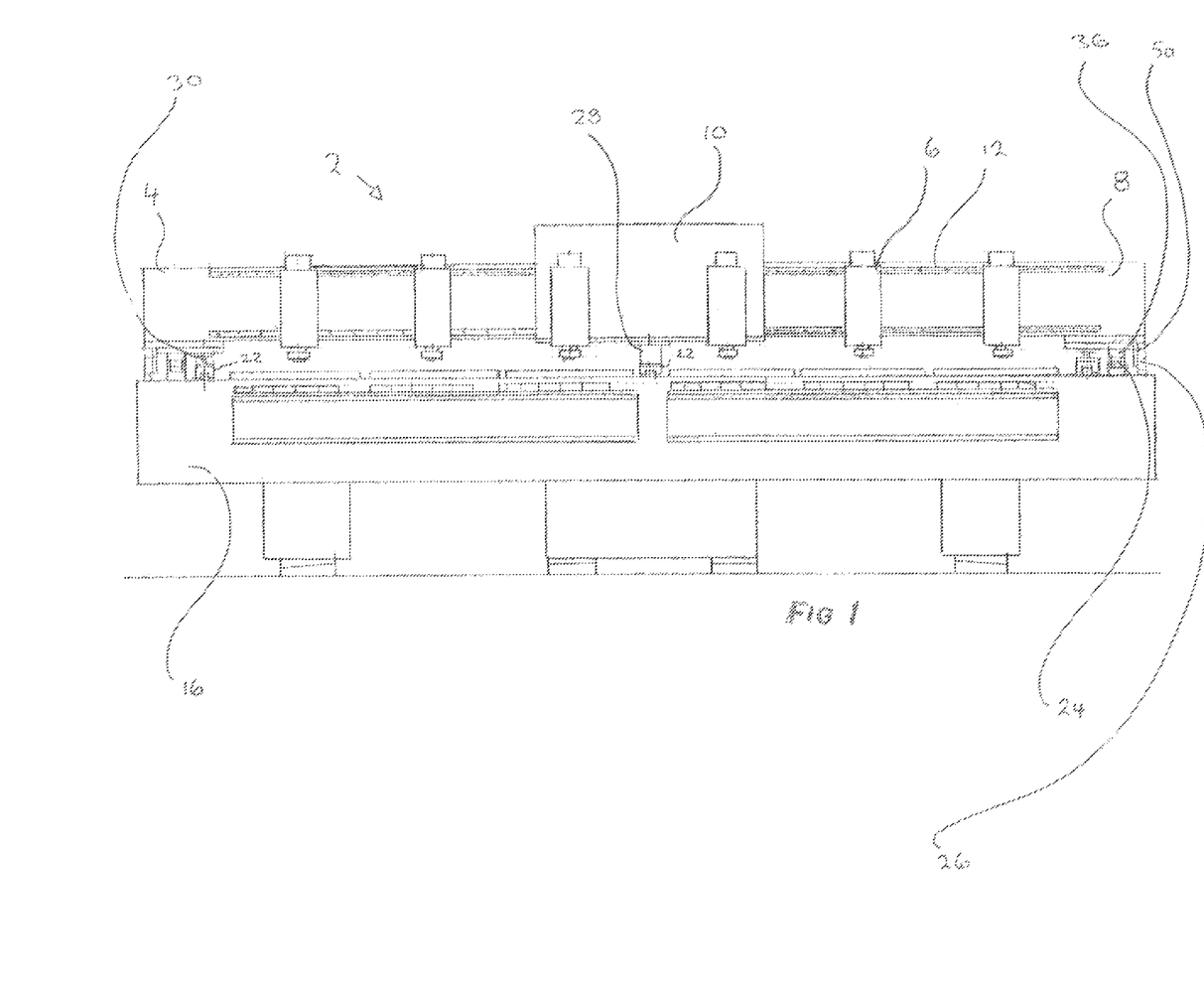
FIG. 1 is a front view of a PCB substrate drilling machine using the Y axis beam positioning system with dual, parallel linear drives (motors) and dual linear drive positioning sensors on a series of guiding tracks (rails).
Figure 2:
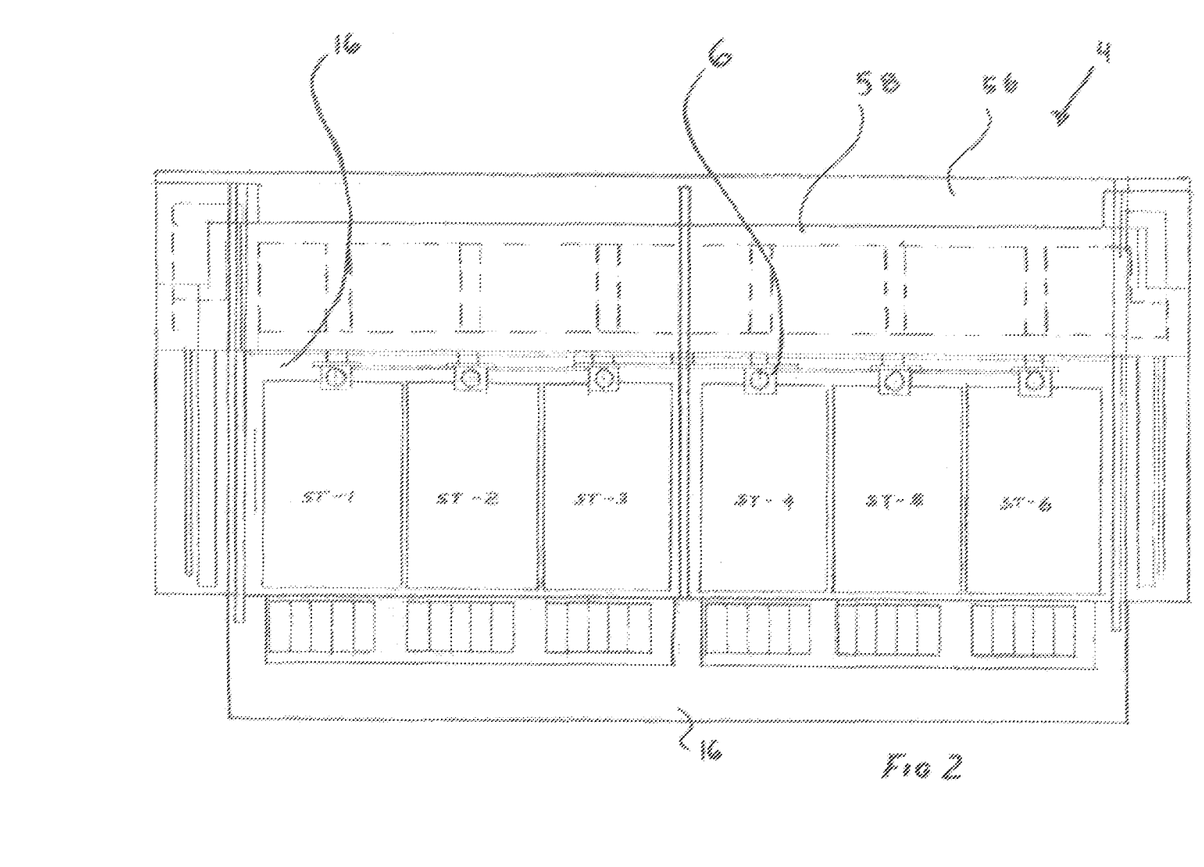
FIG. 2 is a top view of a PCB substrate drilling machine using the Y axis beam positioning system with dual, parallel linear drives (motors) and dual linear drive positioning sensors on a series of guiding tracks (rails).
Figure 3:
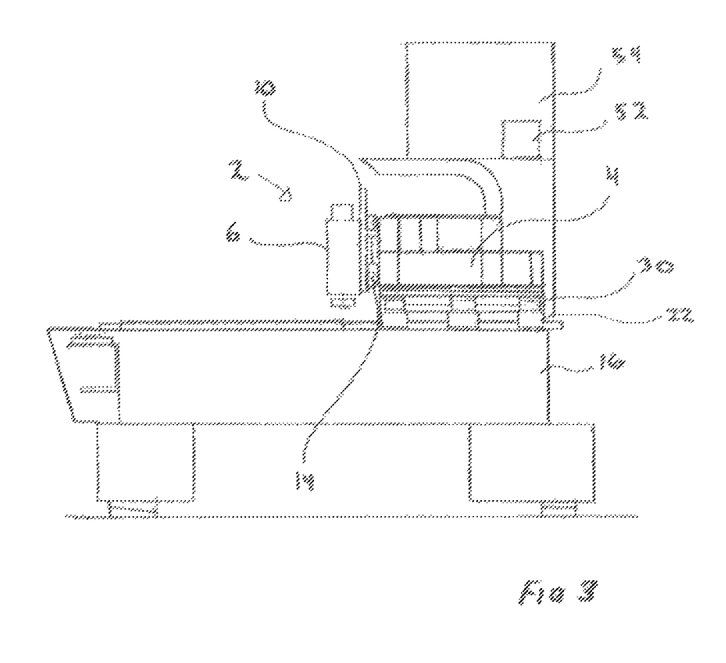
FIG. 3 is a side view of a PCB substrate drilling machine using the Y axis beam positioning system with dual, parallel linear drives (motors) and dual linear drive positioning sensors on a series of guiding tracks (rails).
Figure 4:
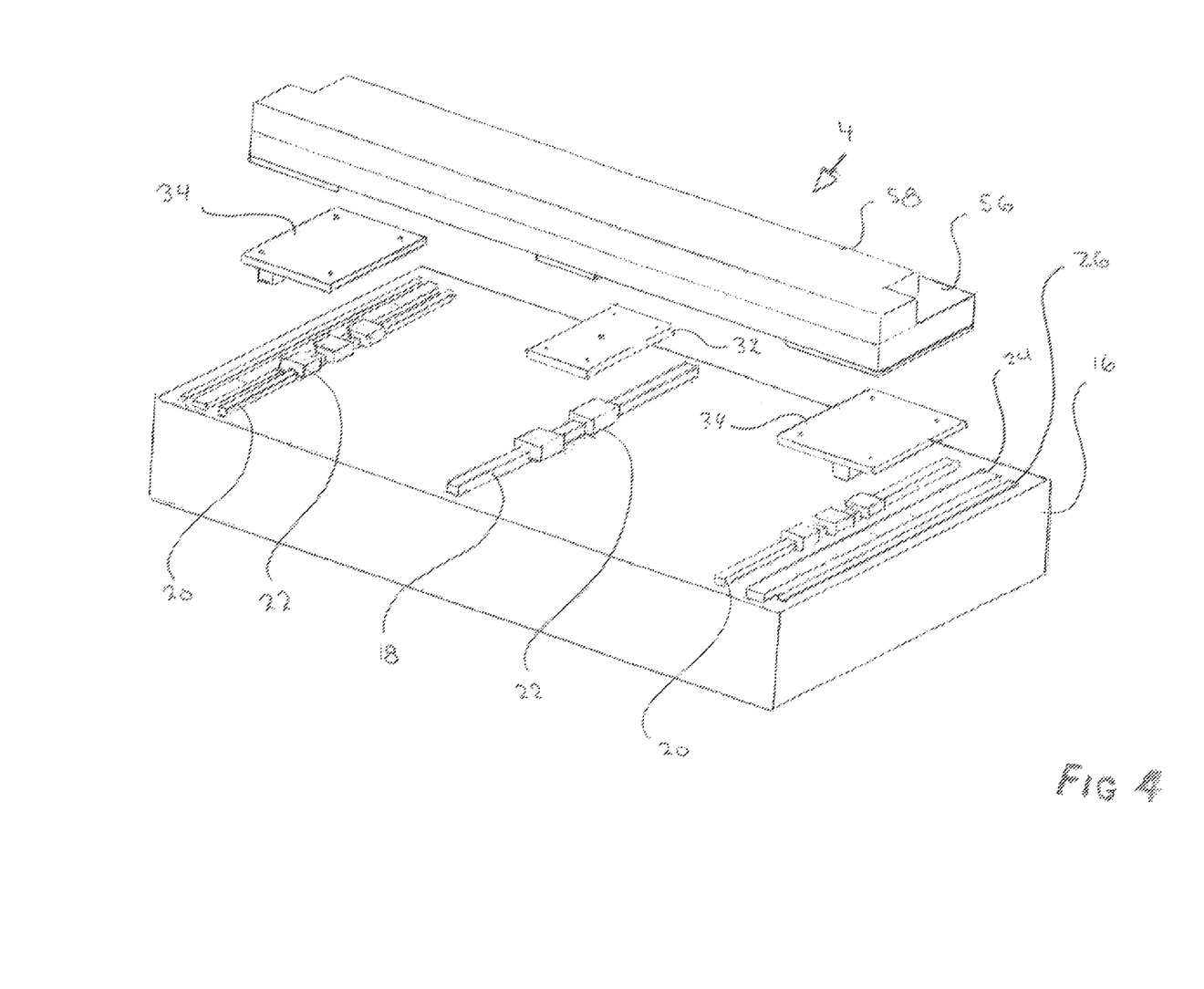
FIG. 4 is a perspective view of a PCB substrate drilling machine using the Y axis beam positioning system with dual, parallel linear drives (motors) and dual linear drive positioning sensors.
Figure 5:
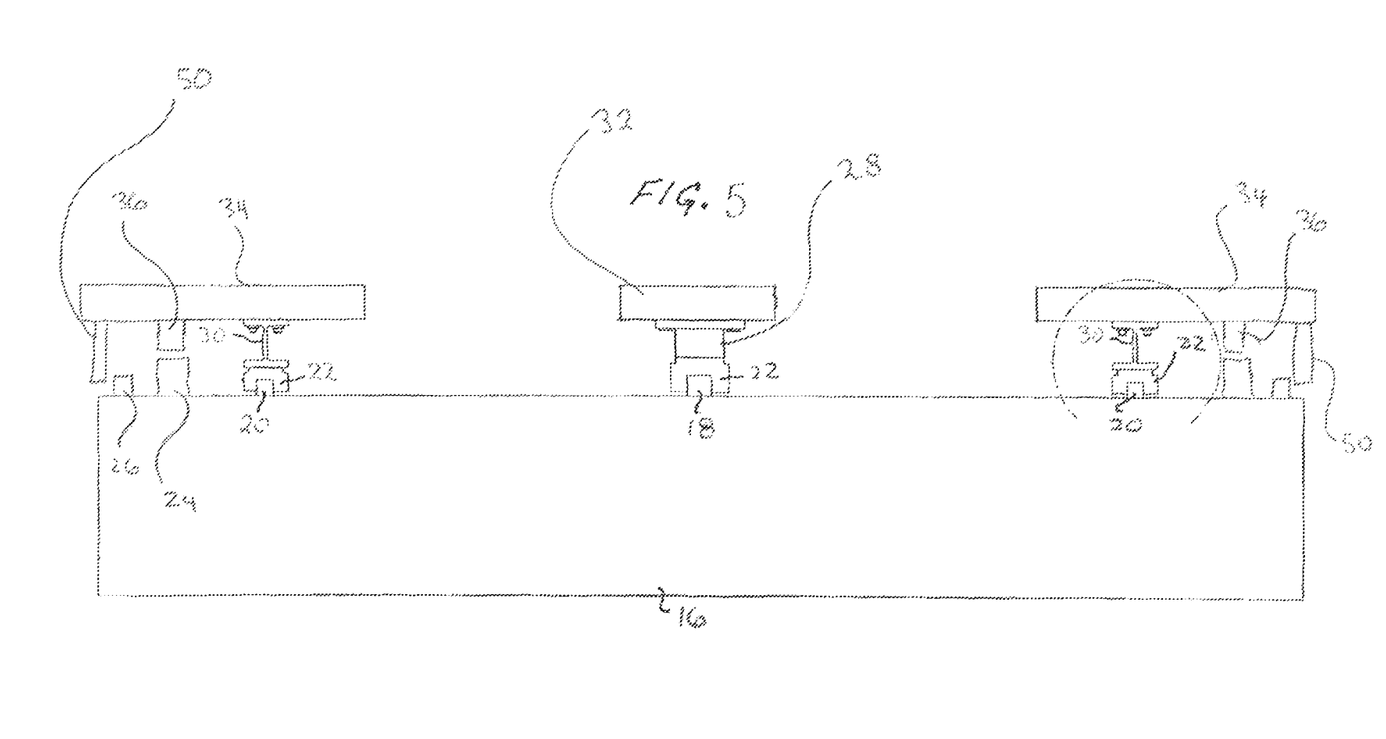
FIG. 5 is a simplified front view of the PCB substrate drilling apparatus illustrating the Y axis rails.

Looking at FIGS. 1 and 5 the position feedback sensor 50 can be seen mounted to the underside of the beam 4 so as to reside in close proximity to the scale 26. Generally, Y axis position feedback is done by a high resolution feedback sensor unit that includes an encoding strip (scale 26) on the base 16, and an optical encoder (position feedback sensor 50) on the beam 4 that senses the encoding strip, although it is known that other position feedback sensor units may be utilized with this present invention.

In operation, when called upon to move the drills in the Y axis, a computer signals a linear motor drive software controller to move the Y axis gantry to the desired position. The controller provides computerized signals to drive each of the two linear drive motors 36 in a synchronous fashion along a path defined by their linear motor magnets 24. Each of these resides at one of the ends of the beam 4. Being driven in close tolerance synchronization, the beam 4 is moved parallel to the Y axis such that the linear axis of the beam 4 moves parallel to the Y axis. While in motion, each of the high resolution position feedback sensors 50 senses their scales 26 and relays their Y axis position back to the motor drive software controller which makes the necessary adjustments in the drive signals sent to each of the linear drive motors 36 such that their scalable positions (and the two ends of the beam 4) remain aligned and the beam 4 moves parallel to the Y axis. With this style of driving the Y axis beam remains much stiffer overall as compared to being driven by a single motor from the center of the Y axis beam 4. Additionally since the beam 4 is adjusted from each end the accuracy of adjustment is much finer. It allows the beam to be "pulled" into position rather than being "wiggled" end by end into position as is in the case of the single linear drive motor, center drive design. With the center drive design there is commonly 7-12 microns of flex (positional differences) between the ends of the beam 4 during movement. This requires more settling movements by the single motor at the final position. With the dual motor design, this range of flex is in the 2-3 micron range. Thus there is less final positional settling to be done.

The construction of the beam 4 is also critical to the operation of the present invention. It must be lightweight and extremely stiff. This is accomplished by using a frame made of a series of rectangular thin wall tubes with edge and corner braces of angle steel that are glued together with a special epoxy adapted for joining metal that never fully hardens. There is a laminate steel skin glued over the frame, also with the same special epoxy. There is a beam bottom half 56 and a smaller beam top half 58. These are glued together to make one big beam. The notch on the top half beam 58 allows for the placement of a cable conduit that routes the cables for air, electricity, electronic data transmission, etc into the PCB drilling machine. The beam bottom half 56 extends farther to support the rails/bearings etc. The beam top half 58 is shorted to remove unnecessary mass. Keeping the beam top half 58 thinner keeps the overall mass of the beam 4 down but it still maintains the stiffness in the Z axis and allows it the strength to handle moments.

By design, the natural frequency of the beam 4 is a lot higher than the operating frequency of the PCB drilling machine which allows the positioning to be accomplished a lot easier. It makes it easier to bring the beam 4 into position because the beam 4 does not oscillate forever once it reaches its Y axis position. This is normally corrected by the scales 26 and the motors 36 in a decreasing "dying" curve of motion. The bigger the mass the harder it is to start and stop plus the more positioning force results in more deflections. Thus using dual beam and drives when positioning, the settling time is a lot less.

The high resolution linear scales (those operable within a fraction of a micron) can compensate for thermal expansion because they are located at the two ends of the Y axis beam.

This dual, parallel linear drive and dual linear drive positioning unit design with a light, stiffened beam 4 using flexure mounts 30 has several benefits. It minimizes the settling time of the positioning feedback sensors (the time after the positioning of the moveable base is completed until the sensor sees no further movement or backlash and can initiate the signal to begin the drilling.) It also compensates for differences in the thermal expansion of the machine components (especially the beam 4 and the base 16) by spreading out the beam expansion in two directions. It gives more accurate positional feedback for the beam's average position which is critical, as this feedback controls the Y axis positioning motors. (When the location of the feedback sensors are positioned too far away from the extreme ends of the beam it will lose its ability to properly measure the average y axis positions of the various locations along the beam where drill units are mounted.) With this novel setup, guiding from the center is not relied upon to get accuracy at the ends of the beam. Thus the stiffness of the beam is not relied upon to determine the precision of the positioning. Rather, we rely on the two position feedback sensor units on each end of the beam 4 to track the accuracy, thus the errors in either end can be compensated for by these feedback units and the motors. Each position feedback sensor units keeps its own end in synchronization such that the beam 4 can be positioned parallel to the Y axis plus or minus 2 microns (Note that the error in guiding has a sixfold magnification when guiding a 14 foot beam from the middle.) With this design, each end of the beam 4 is kept in alignment with each other by positioning not by guiding. Guiding relies on the stiffness of the beam 4. To get a stiff beam 4 we must increases the beam's mass and this lowers the natural frequency, and increases the spring time. Additionally, when there are two guiding motors 36 and rails 20, the moments imparted into the beam 4 by the x axis drilling are compensated for at either end of the beam 4 rather than being transmitted to the center of the beam 4 where the prior art style central, single motor would have to make all the compensation.

The combination of these fixes maintains the overall beam geometry and location resulting in shorter cycle times (due to quicker positioning sensor settling times.) Simply stated, the output of the present invention far exceeds that of the prior art and provides a much more accurately positioned hole on the PCB substrates. When the present invention is incorporated into either style of PCB drilling machine, it utilizes ⅓ less energy to operate while at the same time decreasing the position settling times by 50%. And more importantly, it does this with a settling window ("in position window") of 2-3 microns, beating the current industry standard of 7-12 microns. It accomplishes this through a novel synergistic overall design that utilizes a much lighter and much stiffer moving mass resulting in the moving components having an increased natural frequency. One of the more dramatic advantages of using this system on either style of PCB drilling machine is that the drill bit life is extended in two ways: they do not dull as fast and they do not break as often. This is because the small in position (settling) window ensures that as the drill bits begin their plunge into the substrate to be drilled (PCB board) the drill unit sees very little motion in the Y axis keeping the bits from wandering upon hole initiation and from experiencing excessive horizontal plane sheer forces (side loading) when beginning their plunging into the substrate. This quick and accurate positioning also allows for less revolutions of a drill bit to make a hole as compared to the conventional positioning systems. This puts much less wear and tear on the drill bits and prolongs their functional life.

The above description will enable any person skilled in the art to make and use this invention. It also sets forth the best modes for carrying out this invention. There are numerous variations and modifications thereof that will also remain readily apparent to others skilled in the art, now that the general principles of the present invention have been disclosed. For example, the present invention of a Y axis beam positioning system can be incorporated into a PCB drilling machine or any other like production machine requiring precise positioning in the Y or X axis. The beam moves in the horizontal X-Y plane and the designations of the X axis and Y axis could be interchanged depending on the orientation of the Cartesian coordinate system. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Having thus described the invention, what is claimed as new and desired to be secured by Letters Patent is as follows:

1. A positioning system for use with a horizontally moving gantry adapted for integration with a PCB drilling machine, comprising:
   a linear beam capable of movement in the X axis or the Y axis of the X-Y plane, said beam having two ends and a center;
   at least three parallel guiding rails, two of which are located beneath an end of said linear beam and one of which is located beneath said center of said linear beam;
   at least three linear guides affixed between said parallel guiding rails and said linear beam, at least two of said linear guides located at said beam ends and at least one of said linear guides located at said beam center;
   at least one solid block mount between said center of said beam and said linear guide located at said center of said beam;
   at least two flexure mounts each between one of said ends of said beam and said linear guides located at said ends of said beam;
   at least two squaring plates each of which is affixed between one of said flexure mounts and one of said ends of said beam;
   at least two linear drive systems, each affixed to one end of said linear beam;
   at least two high resolution position feedback sensor units capable of providing a signal corresponding to a position of said ends of said beam to a software controller;
   at least one software controller; and
   at least one computer system;
   wherein said software controller receives position signals from said position feedback sensor units and desired location data from said computer system and algorithmically generates and provides signals to each of said linear drive systems to move said beam in the X axis or the Y axis of the X-Y plane.

2. The positioning system for use with a horizontally moving gantry of claim 1 wherein said signals to each of said linear drive systems to move said beam in the X axis or the Y axis of the X-Y plane are synchronized signals so as to coordinate synchronized movement from both of said ends of said beam.

3. The positioning system for use with a horizontally moving gantry of claim 1 wherein said linear drive systems each comprise a linear motor that resides about a portion of a linear motor magnet, said linear motor magnets formed as linear magnetic strips that reside parallel to each other and parallel to said guiding rails.

4. The positioning system for use with a horizontally moving gantry of claim 1 wherein said high resolution position feedback sensor units are each comprised of a high resolution position feedback sensor affixed to said beam that resides adjacent a portion of an encoding strip affixed to a base upon which said PCB machine sits.

5. The positioning system for use with a horizontally moving gantry of claim 4 wherein said encoding strips reside parallel to said guiding rails.

6. A positioning system for use with a horizontally moving gantry adapted for integration with a PCB drilling machine, comprising:

- a linear beam capable of movement in the X-Y plane, said beam having two ends and a center;
- at least three parallel guiding rails, two of which are located beneath an end of said linear beam and one of which is located beneath said center of said linear beam;
- at least three linear guides affixed between said parallel guiding rails and said linear beam, at least two of said linear guides located at said beam ends and at least one of said linear guides located at said beam center;
- at least two linear drive systems, each partially affixed to one of said ends of said linear beam;
- at least one solid block mount between said center of said beam and said linear guide located at said center of said beam;
- at least two flexure mounts each between one of said ends of said beam and said linear guides located at said ends of said beam;
- at least two squaring plates each of which is affixed between one of said flexure mounts and one of said ends of said beam;
- at least two high resolution position feedback sensor units capable of providing a signal corresponding to a position of said ends of said beam to a software controller; and
- at least one computerized software controller;
- wherein said software controller receives position signals from said position feedback sensor units and algorithmically generates and provides signals to each of said linear drive systems to move said beam in the X axis or the Y axis of the X-Y plane, and
- wherein said beam is formed from a frame of rectangular walled tubing with edge and corner braces of angle steel glued thereon, and an outer skin of sheet metal glued onto said frame.

7. The positioning system for use with a horizontally moving gantry of claim 6 wherein said beam is made of an upper beam and a lower beam glued together.

* * * * *